US010634738B2

(12) United States Patent
Cook et al.

(10) Patent No.: US 10,634,738 B2
(45) Date of Patent: Apr. 28, 2020

(54) ZEEMAN SPLITTING VECTOR MAGNETOMETER APPARATUS AND METHOD

(71) Applicant: Texas Instruments Incorporated, Dallas, TX (US)

(72) Inventors: Benjamin Cook, Addison, TX (US); Juan Herbsommer, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 239 days.

(21) Appl. No.: 15/665,282

(22) Filed: Jul. 31, 2017

(65) Prior Publication Data

US 2019/0033400 A1 Jan. 31, 2019

(51) Int. Cl.
G01R 33/032 (2006.01)

(52) U.S. Cl.
CPC .................. G01R 33/032 (2013.01)

(58) Field of Classification Search
CPC .............. G01R 33/26; G01R 33/032
See application file for complete search history.

(56) References Cited

U.S. PATENT DOCUMENTS

| 8,212,556 | B1* | 7/2012 | Schwindt | G01R 33/26 324/301 |
| 10,274,549 | B1* | 4/2019 | Ledbetter | G01R 33/26 |
| 2009/0080479 | A1* | 3/2009 | Jau | G04F 5/14 372/27 |
| 2014/0247045 | A1* | 9/2014 | Kornack | G01R 33/26 324/304 |
| 2016/0154073 | A1* | 6/2016 | Nagasaka | G01R 33/26 324/304 |
| 2017/0010337 | A1* | 1/2017 | Morales | G01R 33/26 |

* cited by examiner

Primary Examiner — Son T Le
Assistant Examiner — Adam S Clarke
(74) Attorney, Agent, or Firm — Michael A. Davis, Jr.; Charles A. Brill; Frank D. Cimino

(57) ABSTRACT

A magnetometer for measuring an external magnetic influence proximate the magnetometer. The magnetometer has: (i) a volumetric enclosure for storing an alkali metal; (2) a laser proximate the volumetric enclosure and having an axis in a first dimension and along which photons are directed toward a first surface of the volumetric enclosure; (3) a photodetector proximate a second surface of the volumetric enclosure and for receiving light emanating from the laser and passing through the volumetric enclosure, wherein the photodetector is for providing a photodetector signal in response to an intensity of light emanating from the laser and passing through the volumetric enclosure; and (4) at least one magnetic field reducer for providing a magnetic field in a second dimension orthogonal to the first dimension.

13 Claims, 4 Drawing Sheets

ZEEMAN SPLITTING VECTOR MAGNETOMETER APPARATUS AND METHOD

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to magnetometers and, more particularly, to a Zeeman splitting vector magnetometer apparatus and method.

Magnetometers measure magnetic fields and are used in numerous fields and endeavors, including scientific experiments and observation, medical systems, and military applications. Atomic magnetometers are highly sensitive and thereby permit the measure of magnetic forces that are extremely small, even relative to the earth's magnetic field. However, such devices typically involve plural lasers and often measure only magnetic field strength (i.e., scalar) or direction, whereas to determine both strength and direction as a complete vector, complicated or duplicative apparatus may be required.

By way of further background, the prior art includes various approaches to an atomic magnetometer that use a vapor cell in which heated atoms of an alkali metal (e.g., cesium or rubidium) are suspended via a buffer gas, and two lasers are oriented to emit photons in perpendicular paths relative to one another through the cell. A first laser is considered a pumping laser, in that it pumps photons into the alkali atoms so as to polarize the atoms by populating spin states, and then the second (and lower-powered) laser is considered a probe laser in that it measures the frequency of the spin precession of the polarized atoms, also known as the Larmor frequency, so as to determine a amplitude of magnetic field which is proportional to the measured Larmor frequency. As indicated above, however, such an approach measures only the magnetic field scalar amplitude, and not direction. To get a full magnetic vector (i.e., amplitude and direction), such an approach can be packaged with three different magnetometers, each oriented in a plane orthogonal to the others, but with the added cost and complexities of such an approach.

Thus, while the prior art approaches have served various needs, the present inventors seek to improve upon the prior art, as further detailed below.

BRIEF SUMMARY OF THE INVENTION

In a preferred embodiment, there is magnetometer for measuring an external magnetic influence proximate the magnetometer. The magnetometer comprises: (i) a volumetric enclosure for storing an alkali metal; (2) a laser proximate the volumetric enclosure and having an axis in a first dimension and along which photons are directed toward a first surface of the volumetric enclosure; (3) a photodetector proximate a second surface of the volumetric enclosure and for receiving light emanating from the laser and passing through the volumetric enclosure, wherein the photodetector is for providing a photodetector signal in response to an intensity of light emanating from the laser and passing through the volumetric enclosure; and (4) at least one magnetic field reducer for providing a magnetic field in a second dimension orthogonal to the first dimension.

In other preferred embodiments, the magnetometer comprises additional apparatus for measuring the external magnetic influence, such as a processor, responsive to the photodetector signal, for measuring a first magnetic field intensity, of the external magnetic influence, in the first dimension, and responsive to the at least one magnetic field reducer and an additional magnetic field reducer, in response to which the processor measures a respective second and third magnetic field intensity corresponding respectively to the second dimension and a third dimension, the third dimension orthogonal to the first dimension and the second dimension.

Numerous other inventive aspects are also disclosed and claimed.

DETAILED DESCRIPTION OF EMBODIMENTS

Figure 1:
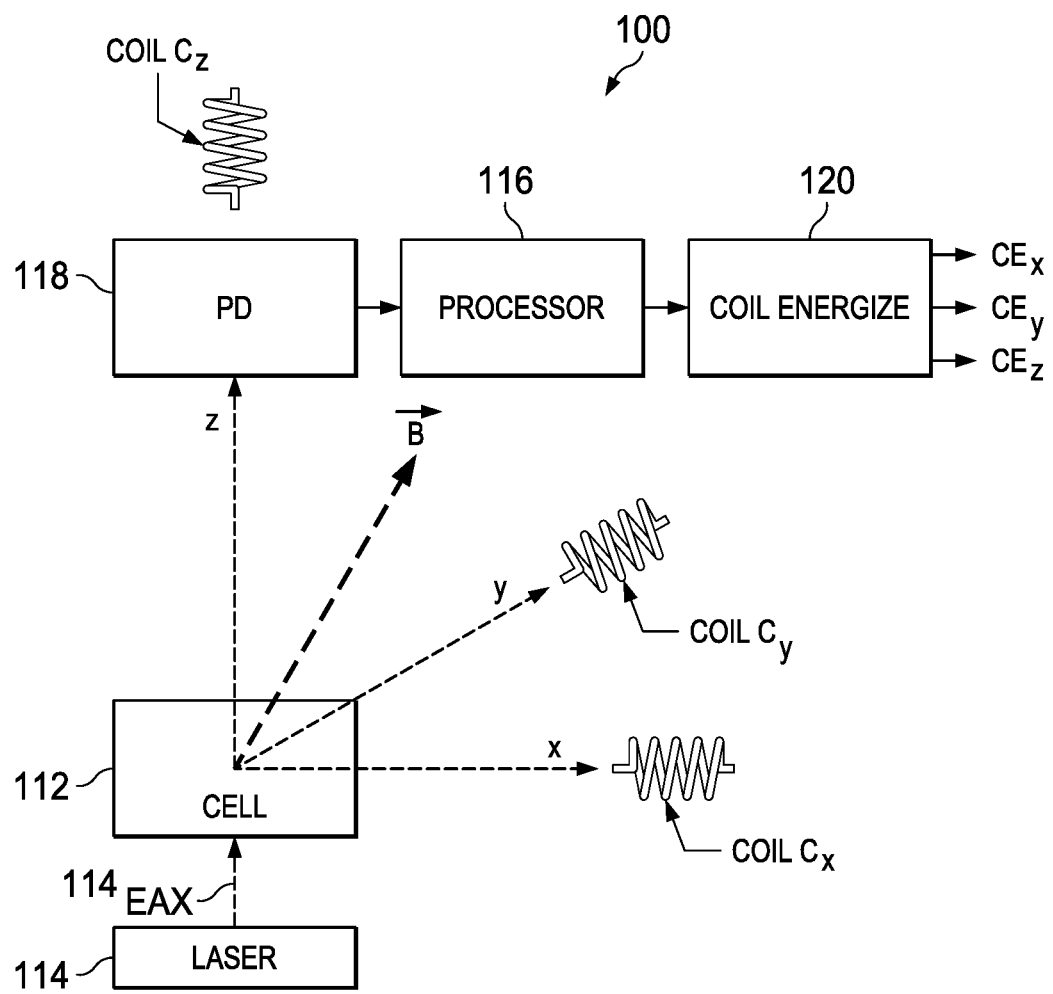
FIG. 1 illustrates a general electrical and functional block diagram of a preferred embodiment magnetometer, wherein the illustrated coils are shown from a dimensional standpoint rather than an actual physical attachment relative to the magnetometer cell.

FIG. 1 illustrates an electrical and functional block diagram of a preferred embodiment magnetometer 100, which, as its name connotes, is operable to measure a magnetic field in the area of the device. Indeed, as detailed below, both the amplitude and direction of that magnetic field is determinable by magnetometer 100, implemented by inventive apparatus and methodology as will be appreciated by one skilled in the art given the teachings of this document.

Magnetometer 100 includes a cell 112, that is, a volumetric enclosure that may of various shapes and is shown by way of example as a cube, with transparent (e.g., glass) sides and that provides a volume through which light photons from an adjacent laser 114 may be projected toward, and in various instances through, cell 112. Preferably, the volume of cell 112, like the prior art, stores atoms, preferably of an alkali metal, such as cesium. The alkali metal atoms may be suspended via a buffering gas, such as nitrogen, or multiple gases, that are selected so as to not interfere with light passage, and where cell 112 is also heated by separate apparatus (not shown) as to provide a vapor.

In a preferred embodiment, laser 114 is operable to emit photons at a selected tuning frequency, $f_t$, as provided from and adjusted by a processor 116, and as noted above photons so emitted are directed toward cell 112. Laser 114 may be implemented, in one preferred embodiment example, as a vertical-cavity surface-emitting laser (VCSEL), which is a semiconductor-based laser diode that emits a highly efficient optical beam along a line of sight or directionality shown as an axis $114_{EAX}$ that is orthogonal from its top surface, whereby way of example therefore the beam direction is vertical when the semiconductor die is horizontal. In any event, the laser axis $114_{EAX}$ is directed toward cell 112, so that laser photons pass through the cell glass and interact with the alkali atoms inside cell 112. In this regard and for sake of orientation and later discussion, FIG. 1 illustrates by way of reference that axis $114_{EAX}$ is along a z-dimension in three dimensional space. Note further that the precision of laser 114 allows it to be excited with a voltage/current that adjusts tuning frequency $f_t$ so as to create side band peaks around a fundamental frequency, where as detailed later each side band provides a respective excitation energy frequency to the atoms in cell 112. Then, by exciting a VCSEL laser with a proper RF frequency, the laser emits two sidebands at a distance $2xf_{RF}$ and these two streams of photons are coherent (i.e., referenced to the same phase) because they are coming from the same source. In the preferred embodiment and as detailed later, the frequency of the excitation RF to the VCSEL laser is selected so that the difference in frequency between the two sidebands coincides exactly with the energy between two quantum states between which coherent population trapping (CPT) is desired. Further and as detailed later, the adjustability of tuning frequency $f_t$ permits electromagnetic radiation, in the form of photons from laser 114, to be imposed on the alkali atoms in cell 112, so as to achieve coherent interaction between the energy and atoms. Lastly, note that in an alternative preferred embodiment, two lasers may be used in lieu of a single laser 114, where the two lasers are referenced to a common or fixed phase (so-called laser locking or mode locking) and each laser emits a respective different frequency corresponding to a different energy between two quantum states, but maintaining coherency between the frequencies would be imperative and likely more difficult to achieve than the VSEL; further, with this two-laser alternative, then preferably these two lasers are be parallel and ideally superimposed interrogating cell 112 (e.g., by having co-axial emitting axes).

Magnetometer 10 also includes a photodetector (PD) 118, which is positioned adjacent cell 112 and on an opposite side of cell 112, relative to where photons are received by cell 112 from laser 114. Thus, PD 118 is aligned along the light emission axis $114_{EAX}$ emanating from laser 114, on the opposite side of cell 112, which therefore also positions PD 118 along the z-axis. Thus, to the extent that light emitted by laser 114 passes through cell 112, then PD receives such light and, as known in the PD art, provides a voltage signal $v_{PD}$ proportional to the intensity of the received light. Moreover, as detailed later, the amount of light passing through cell 112, and hence the amplitude of voltage signal $v_{PD}$ is in part as modulated by atomic response to energy within cell 112. Voltage signal $v_{PD}$ is connected to processor 116, as may be achieved through an analog-to-digital interface, so as to facilitate a spectral analysis of quantum effects in the system of magnetometer 100, so as ultimately to determine the amplitude and directionality of the external magnetic field near cell 112, where that field is designed in this document as $\vec{B}$. In this regard, therefore, magnetometer achieves, as its name suggests, a measure of magnetic field, where in the preferred embodiment the measure includes both amplitude and direction.

Further in connection with the operation of processor 16 to determine $\underline{B}$, magnetometer 100 also preferably includes a plurality of magnetic field reducers, each preferably in the form of coils, shown in FIG. 1 as coils $C_x$, $C_y$, and $C_z$, where as detailed later one of the three coils (e.g., $C_z$) is optional. Each coil designator subscript (i.e., x, y or z) further indicates a preferred spatial alignment of the respective coil relative to the others, to cell 112, and to the directionality of laser 114, in a respective one of the x-dimension, y-dimension, and z-dimension. Note that for simplifying the drawing and facilitating an understanding, the coils are shown in FIG. 1 from a dimensional standpoint rather than an actual physical attachment relative to cell 112; thus, in a preferred embodiment implementation, each cell may be wrapped around cell 112 or around a support structure surrounding cell 112. As a result of such preferred embodiment positions, the magnetic field of each coil is as homogenous as possible in the area where the beam of laser 114 is interrogating the atoms in cell 112 The coils $C_x$, $C_y$, and $C_z$ are described as magnetic field reducers in that, as detailed later, each coil may be energized separately to affect the magnetic field, in a respective dimension, by the selective energizing of the coil and so as to counteract or offset the otherwise existing presence of an independent magnetic field provided by $\vec{B}$. In this regard, processor 116 is coupled to a coil energizing block 120 which, under control of processor 116, provides respective energizing signals $EC_x$, $EC_y$, and $EC_z$, to coils $C_x$, $C_y$, and $C_z$. Further, as known in the art, applying energy to a coil induces a magnetic field along the longitudinal axis within the windings of the coil (i.e., viewing the coil as cylindrical, then within the cylinder and along its length) and the polarity of the applied energy determines the direction of the induced field; hence, as detailed below, by singularly energizing one of coils $C_x$, $C_y$, and $C_z$, the already existing magnetic field in the area of the coil can be influenced by either an additive or subtractive field, so in the latter case of subtracting or nullifying the already existing magnetic field, each such coil achieves the effect of a magnetic field reducer.

Preferred embodiments also avail of the electron/nucleus interaction in atoms as well as the Zeeman effect, so a brief overview is herein presented as will be further understood by one skilled in the art. With respect to the electron/nucleus interaction, at one time electrons were perceived as existing at singular outer energy or spectral band locations. Since then, however, it has been observed that there is an interaction of a particle's spin with its motion, sometimes referred to as a sping-orbit interaction. In the case of an atomic electron, this interaction causes a split of the spectral line into two different energy levels, due to electromagnetic interaction between the electron's spin and the magnetic field generated by its orbit around the nucleus. In addition, the Zeeman effect, named after physicist Pieter Zeeman, describes the splitting of an energy (or spectral) line into multiple components due to the presence of an external magnetic field. With respect to an electron, therefore, each of its two sping-orbit interaction energy levels is further split into three levels, a first level at the energy of the originating level (i.e., one at each of the sping-orbit interaction energy levels), and a second and third, each at equal energy distances, one greater, and one lesser, than the originating level. Moreover, the distance between each of the second and third levels to the first level is a function of the external magnetic field, or stated conversely, the amplitude of the external magnetic field is determinable from determining the energy level at which an atom is located.

Preferred embodiments also avail of coherent population trapping (CPT), so a brief overview also is herein presented as will be further understood by one skilled in the art. CPT is a quantum interference technique that applies energy (e.g., from dual laser frequencies) to a system to eliminate absorption in an otherwise opaque (i.e., partially absorbent) medium. In particular, in CPT, energy is pumped into the system so as create two coherent superposition states from the lower atomic levels (or states). At a particular two-photon resonance, the system is decoupled from optical field so as to create a so-called dark state; thus, by evaluating peak light transmission through the medium, the frequency at which the dark state occurs is readily ascertainable in that the point of maximum intensity corresponds to minimal (or zero) absorption, thereby representing that the system has achieved the dark state.

Figure 2:
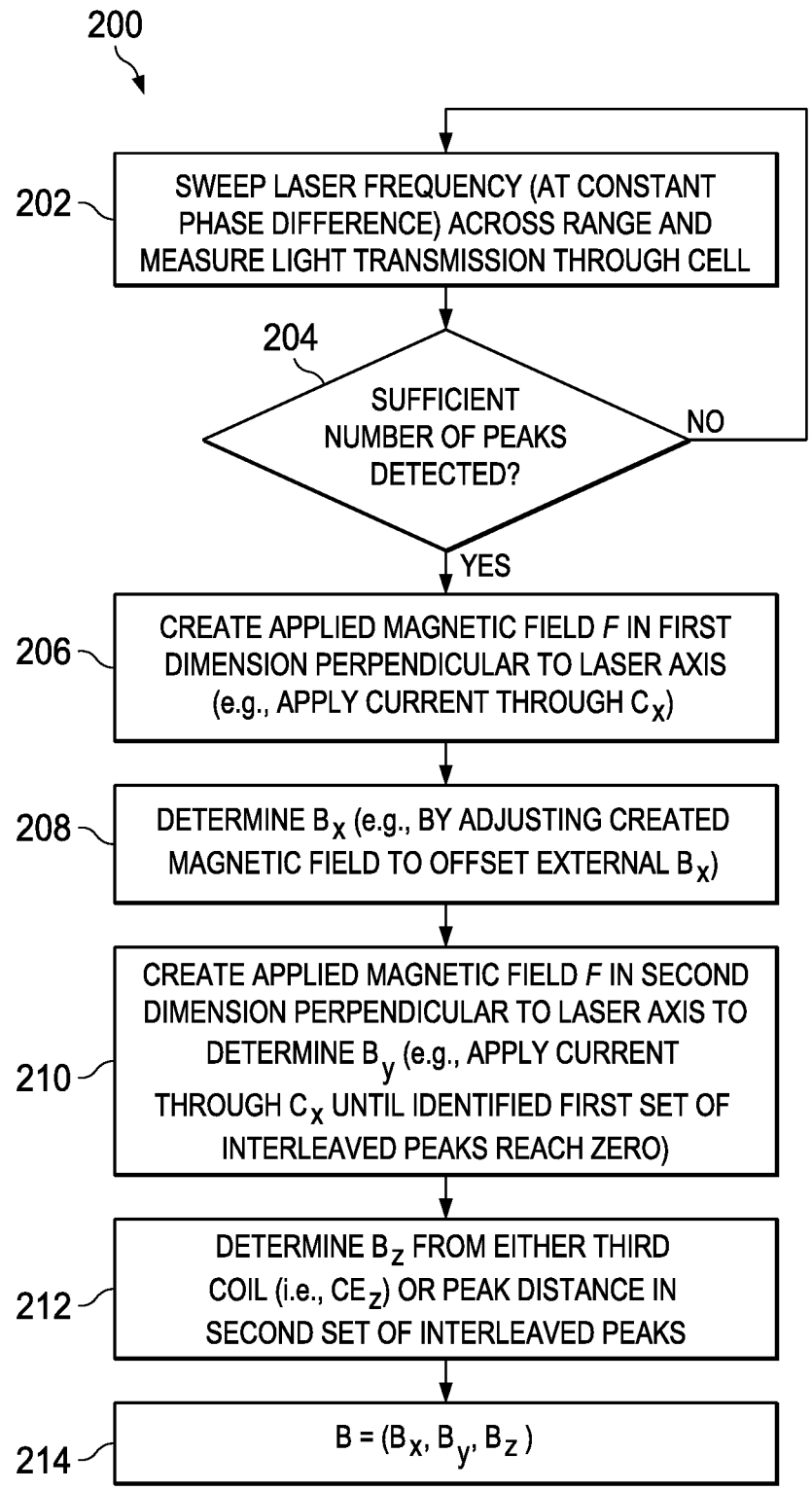
FIG. 2 illustrates a flow chart of a preferred embodiment method of operating the magnetometer of FIG. 1.

Given the introductory aspects detailed above as well as the description of system 100 of FIG. 1, FIG. 2 illustrates a flow chart of a preferred embodiment method 200 of operating system 100, so as to determine $\vec{B}$ (i.e., a magnetic field amplitude and direction). In general, therefore, the steps of method 200 may be achieved by proper programming of processor 116, such as with code stored on-chip or otherwise accessible to that device, whereby processor 116 may sequence through the steps of method 200 in response to programming instructions, and so as to control other parts of system 100, ultimately so as to determine $\vec{B}$.

Method 200 begins with a step 202, where a modulating frequency $f_{rf}$ is applied to laser 114 and is swept across a frequency range. Thus, the earlier introduced frequency of $f_t$ laser-emitted photons is in response to the sweeping frequency $f_{rf}$. Moreover, recall in a preferred embodiment that laser 114 may be a VCSEL. Accordingly, the precision and functionality of laser 114 allow it to be excited with a voltage/current at a tuning frequency $f_t$ so as to create two side band peaks that are $\pm f_t$ relative to a center frequency $f_0$, where the center frequency corresponds to a laser selected based on the alkali atoms (e.g., cesium) of cell 112, and again with coherency between the side band at $f_0+f_t$ and the side band at $f_0-f_t$. In other words, by sweeping $f_t$, step 202 adjusts the frequency difference between the two side bands, while maintaining coherency. As a result of the sweeping frequency and the coherency, then the influence of the laser 114 emitted photons, in combination with the presence of the external magnetic field and the vapor in cell 112, will modulate the amount of light that passes through cell 112 at different frequencies. More particularly, at certain intervals in the frequency sweep, a first side band resonantly couples with a first split Zeeman level while a second side band side band resonantly couples with a second split Zeeman level, thereby placing atoms in the quantum superposition of two hyperfine states, that is, reaching the "dark state" at which no light is absorbed by those atoms. Thus, a sufficiently wide enough sweep ill, at various differential frequencies, cause cell atoms to achieved different respective dark states.

Also in connection with step 202, note that the step measures light transmission through cell 112 by way of PD 118, and peaks in that measure will occur for each instance where the side bands resonantly couple as described above. In other words, the frequency at which the dark state occurs will be readily ascertainable in that the point of maximum light intensity passing through cell 112, as detected by PD 118 and measured by processor 116, thereby corresponding to minimal (or zero) absorption, will occur at each achieved dark state. Further in this regard, FIG. 3 generally illustrates two light measure plots $P_1$ and plot $P_2$ from step 202, representing light intensity in the vertical dimension and frequency differential in the horizontal dimension, where one skilled in the art will therefore appreciate that such intensities are represented in the voltage signal $v_{PD}$, described earlier in connection with FIG. 1. In general, therefore, in the center of FIG. 3, a peak $PK_{1.1}$ occurs for plot $P_1$ and the frequency axis at that point corresponds to a frequency differential (i.e., between the laser sideband frequencies) that created a response to the $0^{th}$ Zeeman level in cell 112, that is, where one frequency sideband causes an excitation from a first lower (e.g., ground) state to a heightened energy state, and where the other frequency sideband causes an excitation from a second lower state to the same heightened energy state. Similarly, to the left of center peak of $PK_{1.1}$, a peak $PK_{1.2}$ occurs corresponding to a sideband frequency differential, less than the sideband frequency differential that caused peak $PK_{1.1}$ (i.e., the $0^{th}$ Zeeman level), where again each sideband frequency excites electrons to move from a respective lower energy state to a same heightened energy state. Likewise, to the right of the FIG. 3 center peak of $PK_{1.1}$, a peak $PK_{1.3}$ occurs corresponding to a frequency differential, greater than the differential that caused the $0^{th}$ Zeeman level, and that also caused electrons to move from respective lower energy states to a same heightened energy state. Having described the peaks with respect to plot $P_1$, note that plot $P_2$ likewise includes peaks (e.g., $PK_{2.1}$, $PK_{2.2}$), each of which also corresponds to two different frequencies which respectively advance electrons from respective lower energy states to a same heightened energy state.

Figure 3:
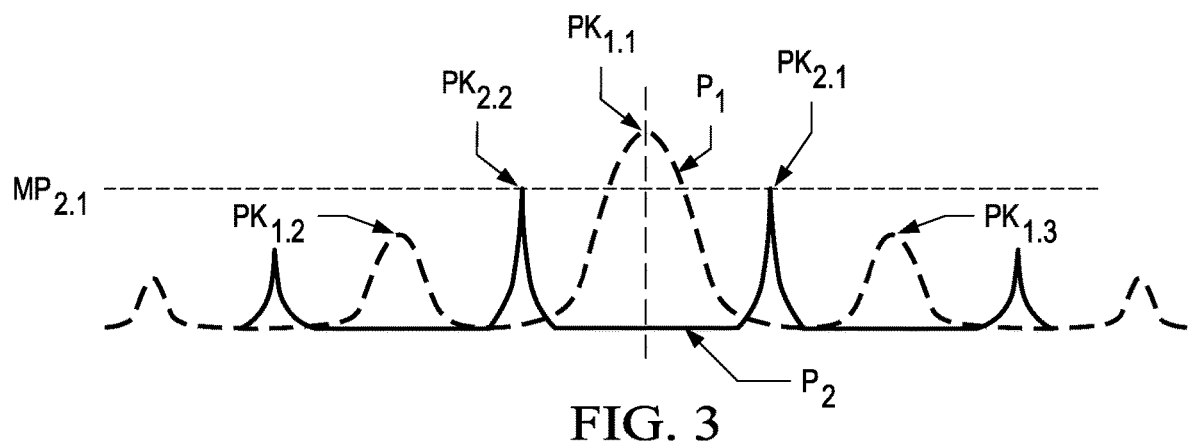
FIG. 3 illustrates a general illustration of an example of light intensity plots measured in the method of FIG. 2.
Figure 4:
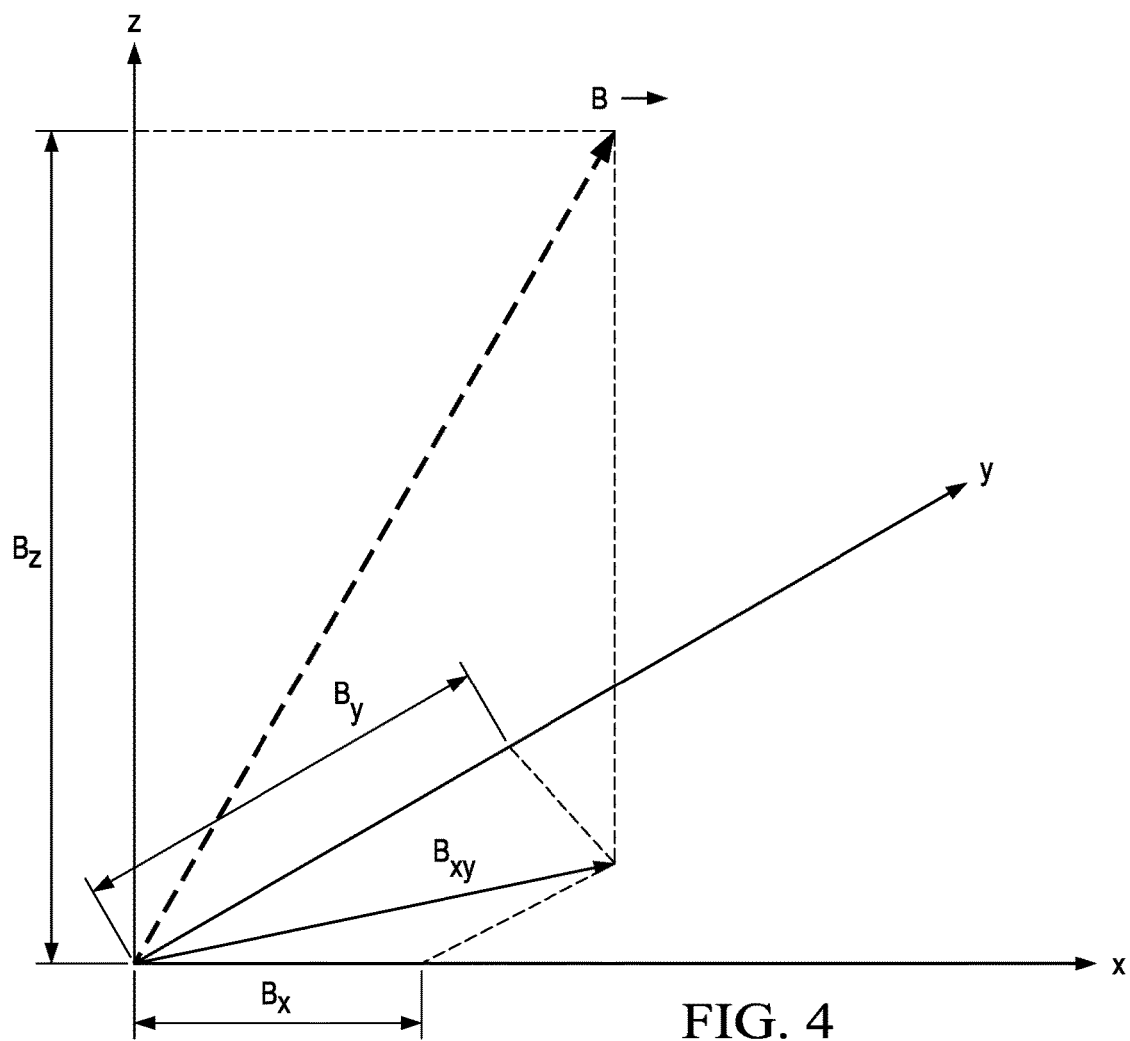
FIG. 4 illustrates a three-dimensional diagram of an external magnetic field $\vec{B}$, and the decomposition of it into $B_x$, $B_y$, and $B_z$.

Further in accordance with preferred embodiments, the FIG. 3 light intensity plots $P_1$ and $P_2$ are interleaved, which as now explained correspond to the effect of the external magnetic field vector $\vec{B}$ on the cell 112 atoms in each of two different dimensions. Particularly, it is recognized that $\vec{B}$ influencing the atoms in cell 112 may be decomposed into three, single-dimensional vectors, $B_x$, $B_y$, and $B_z$, where the subscript for each of these indicates its respective dimensionality according to the three-dimensional space of FIG. 1. By way of example, therefore, FIG. 4 illustrates a three-dimensional plot with an example of $\vec{B}$, and the decomposition of it into $B_x$, $B_y$, and $B_z$. As explained below, therefore, the $B_z$ component is effectively parallel to light energy emitted from laser 114, while the resultant vector of $B_x$ and $B_y$ lies in a plane perpendicular to the light energy emitted from laser 114, that is, in the x/y plane. Each of these dimensional influences is further described below.

Recall that earlier the z-dimension was defined as along the emission axis $114_{EAX}$ of laser 114. As a result, $B_z$ will be parallel to the direction of light from laser 114 through cell 112. Thus, $B_z$ will therefore have a Zeeman effect in a dimension parallel to the light emitted along emission axis $114_{EAX}$. And, this Zeeman effect is manifested in a first of the two plots $P_1$ and plot $P_2$ of FIG. 3, where initially it may be unknown as to which of the two plots corresponds to the parallel dimension.

With one of the two plots $P_1$ and plot $P_2$ corresponding to the parallel influence of $B_z$, the other of the two plots is responsive to external magnetic field influence that is perpendicular to emission axis $114_{EAX}$, and an appreciation of that influence is further understood with reference to FIG. 4.

Specifically, the effect of the magnetic vector $\vec{B}$ in the remaining two dimensions, that is after having singled out the z-dimension along axis $114_{EAX}$, will arise from $B_x$ and $B_y$, which both lie in a plane (i.e., the x/y plane) that is perpendicular to that that z-dimension. In this regard, FIG. 4 further illustrates the components of magnetic vector $\vec{B}$ in the remaining x/y dimensions, shown combined as a resultant vector $B_{xy}$, or as separate component vectors $B_x$ and $B_y$. As result therefore, the combined effect of $B_x$ and $B_y$ (i.e., a vector $B_{xy}$) will therefore have a Zeeman effect in a dimension perpendicular to the light emitted along emission axis $114_{EAX}$ and, therefore, this Zeeman effect is reflected in a second of the two plots $P_1$ and plot $P_2$, that is, the one plot that is not attributable to the parallel influence of $B_z$.

Having introduced the notion that one of plots $P_1$ and $P_2$ is attributable to vector $B_z$ and the other of the plots $P_1$ and $P_2$ is attributable to vector $B_{xy}$, a few additional observations are notable, for purposes of informing one skilled in the art of additional inventive aspects. First, note that the distance between adjacent peaks along a same plot $P_x$ is directly proportional (including a factor of the gyromagnetic ratio of the element, e.g., cesium or rubidium, in cell 112) to the total magnitude of $\vec{B}$, that is, the scalar amplitude value of the resultant vector of $B_x$, $B_y$, and $B_z$. For example, therefore, the distance between peaks $PK_{1.1}$ and $PK_{1.3}$ is therefore proportional to the scalar amplitude value of $\vec{B}$. Thus, if any one or more of $B_x$, $B_y$, and $B_z$ were to increase, the scalar amplitude value of $\vec{B}$ also would increase, as would the distance between plot $P_x$ peaks (e.g., between peaks $PK_{1.1}$ and $PK_{1.3}$). Second, the distance between adjacent peaks of the two different plots is always one-half the distance between adjacent peaks for a same plot. For example, therefore, in FIG. 3, the distance between adjacent differing-plot peak $PK_{1.1}$ and peak $PK_{2.1}$ of the different plots $P_1$ and $P_2$, respectively, is one-half the distance between same-plot peaks $PK_{1.1}$ and $PK_{1.3}$ of plot $P_1$. Given this second consideration, therefore, and recalling from the first consideration that the distance between adjacent same-plot peaks is proportional to the total magnitude of $\vec{B}$, then as that magnitude increases, the same-plot peaks will spread apart in a same amount of distance, for both plots $P_1$ and $P_2$, while each plot $P_2$ peak remains evenly-spaced (i e, halfway) between each plot $P_1$ peak, or vice versa, that is, if that magnitude decreases, the peaks will move closer together. Lastly, note also that when the magnetic field in a direction is increased, it will not only increase inter-peak spacing, but it also will increase the amplitude of the peaks for the corresponding plot. Thus, in the example provided, if plot $P_1$ corresponds to $B_z$, then as $B_z$ increases, the overall peak amplitudes for the corresponding peaks in plot $P_1$ will increase, and conversely if $B_z$ decreases, the overall peak amplitudes for the corresponding peaks in plot $P_1$ will decrease. With these observations, preferred embodiments for identifying the correspondence of plots $P_1$ and $P_2$ to respective ones of the parallel and perpendicular influence, as well as additional determinations from that identification, are explored later in connection with method 200.

Completing a discussion of step 202, note further that the plots of FIG. 3 are only by way of general example and facilitate the remaining discussion and are not necessarily accurate to scale in either intensity, frequency, or shape—a salient illustration, however, is that two different plots will occur from the spectral response of system 10, each having a number of peaks, and with the peaks of one plot being evenly-spaced and interleaved with the peaks of the other plot. Moreover, one skilled in the art should appreciate that the actual step 202 measures need not be plotted per se, but the values measured in step 202 are preferably sampled and stored (e.g., in memory on-board or otherwise accessible to processor 116) so as to be analyzed consistent with preferred embodiments. As detailed below, such measures will include identifying peaks (e.g., by local maxima), analyzing relative peak amplitude when adjustments are made to various coils, and determining the frequency difference between successive peaks in a same dimension, all as further described below.

Step 204 represents a condition check to determine if an adequate number of peaks have been detected so as to facilitate the analysis as described below. If an adequate number of peaks have been attained from the step 202 frequency sweep and corresponding light intensity measures, then method 200 continues to step 206. If an adequate number of peaks have not been attained from the step 202 frequency sweep and corresponding light measures, then method 200 returns again to step 202 so as to further increase the range of the frequency sweep. Once step 204 is satisfied, method 200 continues to step 206.

In step 206, processor 116 operates to create an applied magnetic field, F, independent from the existing external magnetic field $\vec{B}$, in a first direction perpendicular to axis $114_{EAX}$. In a preferred embodiment, this independent magnetic field F is created by selecting a first of the two coils $C_x$ and $C_y$, which recall from earlier have respective axes perpendicular to axis $114_{EAX}$, and applying current to the selected coil so that it generates a magnetic field in the desired direction; thus, by way of example, assume that coil $C_x$ is selected in step 206. More particularly with reference to FIG. 1, therefore, processor 116 controls coil energize block 120 to apply signal $CE_x$ to coil $C_x$, thereby inducing an applied magnetic field, $F_x$, from that coil in the x-direction. Note, therefore, that the induced field $F_x$ will, based on polarity, either add or subtract from $B_x$, that is, the x-dimension component of vector $\vec{B}$. Next, method 200 continues from step 206 to step 208.

In step 210, processor 116 operates to determine the amplitude of $B_x$, that is, the amplitude of the x-dimension magnetic field component created by the external magnetic field vector $\vec{B}$. In a preferred embodiment, the $B_x$ amplitude is derived in connection with the step 206-induction of the applied magnetic field $F_x$, as will now be explained. Particularly, because the total magnetic field in the x-direction is affected by both the magnetic field and from vector $\vec{B}$ and in response to $F_x$ (e.g., from coil $C_x$), then the amplitude of one of plots $P_1$ or $P_2$ in FIG. 3 will move as $F_x$ is changed (and the spacing between peaks will decrease). Further, recall one of those plots represents magnetic field perpendicular to axis $114_{EAX}$, while the other represents magnetic field parallel to axis $114_{EAX}$. Thus, the one of the two plots that moves in response to changes in $F_x$, thereby identifies that plot to be the one relating to the x/y plane, as the movement confirms that the moving plot is in a same dimension as $F_x$. Further in this regard, if $F_x$, based on the polarity of the signal to coil $C_x$, is additive, then the signal amplitude of the identified plot will increase, whereas if $F_x$, based on the polarity of the signal to coil $C_x$, is subtractive, then the signal amplitude of the identified plot will decrease.

Figure 5A:
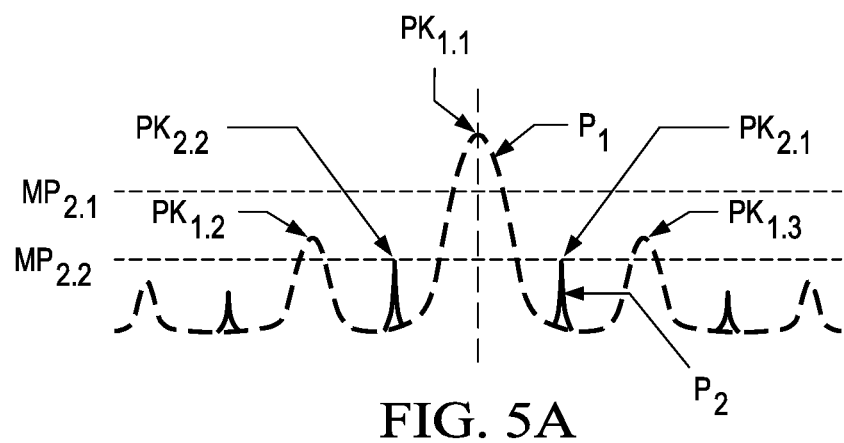
FIG. 5A repeats the illustration of plots $P_1$ and $P_2$ of FIG. 3, where plot $P_2$, where plot $P_2$ has been reduced in response to the opposing magnetic field from a field provided by a first coil in the magnetometer of FIG. 1.

By way of an example illustrating the application of step 208, assume plot $P_2$ is identified as amplitude changing in response to the step 206 applied field $F_x$, and assume further that the identified plot $P_2$ is moving upward. Step 208 then adjusts $F_x$ to determine the point at which $F_x$ maximally offsets the pre-existing magnetic field (i.e., $B_x$) in the same dimension. Hence, in the current example, step 208 first reverses the polarity of signal $CE_x$ to coil $C_x$, so as to reverse the direction of the step 206 field in order to begin subtraction from, rather than addition to, $B_x$. Moreover, step 208 continues to increase the amplitude of the step 206 field, until the affected plot (e.g., $P_2$) reaches a minimum, which thereby corresponds to the point where the step 206 field, as modified by step 208, maximally offsets $B_x$. By way of further explanation, FIG. 5A repeats the illustration of plots $P_1$ and $P_2$ of FIG. 3, where the amplitude of plot $P_2$, however, has been reduced in response to the opposing magnetic field from step 208 (and the peaks are closer together). Thus, whereas plot $P_2$ has a peak amplitude in FIG. 3 of $MP_{2.1}$, that peak amplitude has been reduced, in the x-dimension, to a minimum peak amplitude of $MP_{2.2}$ in FIG. 5A. The illustration is intended to show that plot $P_2$ has been reduced to its minimum, that is, any additional increase in the step 208 induced field would cause a reversal in the decrease of plot $P_2$, that is, with such an increase in the step 208 field, the peak amplitude of plot $P_2$ would reverse from a downward direction from (as shown starting from FIG. 3 and progressing to FIG. 5A), back to an upward direction (e.g., as would be perceived starting from FIG. 5A and back in the direction of FIG. 3). Given the preceding, once step 208 adjusts $F_x$ to drive plot $P_2$ to a minimum, then at that point $F_x$ maximally offsets $B_x$, that is, $F_x$ equals $B_x$, with opposite vector directionality. Moreover, $F_x$ is readily ascertainable (e.g., by processor 116) given the amount of current to coil $C_x$ as determinable from signal $CE_x$, and from the number of windings in coil $C_x$, so from such information step 208 determines $B_x$, in that $B_x=-F_x$. Next, method 200 continues from step 208 to step 210.

In step 210, processor 116 again creates an applied magnetic field, F, independent from the existing external magnetic force from vector $\vec{B}$, but in contrast to step 206, step 210 applies F in a second direction that is both perpendicular to axis $114_{EAX}$ and perpendicular to the step 206/208 applied field. Hence, where step 206 applied $F_x$ in the x-dimension, and with axis $114_{EAX}$ is in the z-dimension, then step 210 applies F in the y-dimension, thusly hereafter referred to as $F_y$. In a preferred embodiment, $F_y$ is created by selecting a second of the two coils $C_x$ and $C_y$, which in this example therefore is coil $C_y$ since coil $C_x$ was selected in steps 206 and 208. Step 210 thus applies current to the selected coil $C_y$ which in response generates a magnetic field in the desired y-dimension. More particularly with reference to FIG. 1, therefore, processor 116 controls coil energize block 120 to apply signal $CE_y$ to coil $C_y$, thereby inducing an applied magnetic field, $F_y$, from that coil in the y-direction. Note, therefore, that the induced field $F_y$, in the y-direction, will based on polarity, either add or subtract from $B_y$, that is, the y-dimension component of vector $\vec{B}$.

Figure 5B:
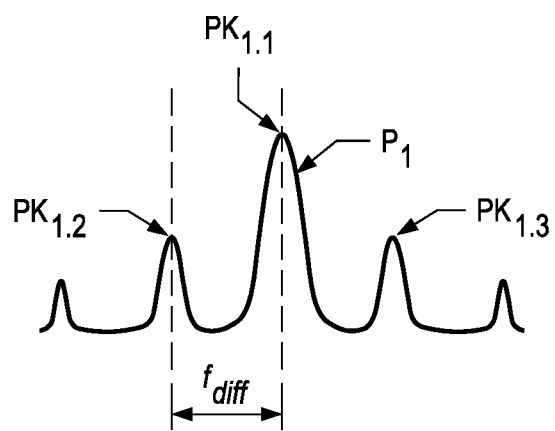
FIG. 5B repeats the illustration of plots $P_1$ and $P_2$ of FIG. 5A, where plot $P_2$ has been reduced to zero in response to the opposing magnetic field from a field provided by a second coil in the magnetometer of FIG. 1.

Further in a preferred embodiment, step 210 adjusts $F_y$ so as to fully offset the remaining component of the external magnetic field from $\vec{B}$ in the x/y plane, that is, that which remains given that coil $C_x$ remains energized per step 208 so as to have offset a part of the x/y plane magnetic field in the x-direction. Thus, step 210 further offsets that external field, but now in the y-direction. Continuing with the earlier example, wherein plot $P_2$ was identified as representative of the magnetic field perpendicular to axis $114_{EAX}$, and with that plot $P_2$ already reduced to a minimum with respect to the x-dimension influence, then step 210 adjusts $F_y$ until plot $P_2$ further reduces to zero. In other words, the amplitude of plot $P_2$ also will move based on the polarity of the signal to coil $C_y$, that is, if $F_y$ is additive, then the signal amplitude of the identified plot will increase, whereas if $F_y$ is subtractive, then plot $P_2$ will decrease. Step 210, therefore, determines the proper polarity of $F_y$ so as to make it subtractive to the field perpendicular to both the x-dimension and axis $114_{EAX}$ (and hence to plot $P_2$), and then step 210 further continues to increase the amplitude of $F_y$ until the affected plot (e.g., $P_2$) reaches zero, which thereby corresponds to the point where $F_y$ maximally offsets $B_y$. By way of further explanation, FIG. 5B repeats the illustration of plots $P_1$ and $P_2$ of FIG. 5A, where plot $P_2$, however, has been further reduced to zero, in response to the opposing magnetic field from step 210. Thus, whereas plot $P_2$ has a reduced amplitude in FIG. 5A of $MP_{2.1}$, after step 208 that peak amplitude has been reduced further to zero by an offsetting force in the y-dimension in FIG. 5B (and, like step 208, any additional increase in the step 210 induced field would cause a reversal in the decrease of plot $P_2$). Given the preceding, once step 210 adjusts $F_x$ to drive plot $P_2$ to zero, then at that point $F_y$ maximally offsets $B_y$, that is, $F_y$ equals $B_x$, with opposite vector directionality. Further, $F_y$ is readily ascertainable given the amount of current to coil $C_y$ as determinable from signal $CE_y$, and from the number of windings in coil $C_y$, so from such information step 210 determines $B_y$ in that $B_y=-F_y$. Next, method 200 continues from step 210 to step 212.

In step 212, processor 116 determines $B_z$, that is, the amplitude of the z-dimension component of the external vector $\vec{B}$. At least two alternative preferred embodiments are contemplated for step 212, and each is described below.

In one preferred embodiment, $B_z$ is determined in a manner comparable to steps 206, 208, and 210, but here with respect to the z-dimension and using the coil $C_z$. In this regard, recall the earlier description stated that coil $C_z$ is optional; as now appreciated, with coil $C_z$ included, it also may be selectively energized so as to create an applied magnetic field $F_z$ so as to offset, and thereby determine the amplitude of, $B_z$. Specifically, in this approach, in step 212 processor 116 controls coil energize block 120 to apply and vary $CE_z$ to coil $C_z$, thereby creating and adjusting $F_z$ until it fully offsets the component of the external magnetic field from $\vec{B}$ in the z-dimension. Continuing with the earlier example, wherein plot $P_2$ was identified as representative of the magnetic field perpendicular to axis $114_{EAX}$, then the other plot, namely, plot $P_1$ is therefore representative of the magnetic field parallel to axis $114_{EAX}$ and, hence, in the present example in the z-dimension. Thus, much like step 210 reduced the plot $P_2$ amplitude to zero to determine $F_y$, then step 212 adjusts $F_z$ until the plot $P_1$ amplitude reduces to zero. Here, therefore, plot $P_1$ will move based on the polarity of the signal to coil $C_z$, so step 212 determines the proper polarity of $F_z$ so as to make it subtractive to the field parallel to both the z-dimension and axis $114_{EAX}$ (and hence as represented by plot $P_1$), and then step 212 further continues to increase the amplitude of $F_z$ until the affected plot (e.g., $P_1$) reaches zero (or a negligible near-zero threshold), which thereby corresponds to the point where $F_y$ maximally offsets $B_y$. At this point, therefore, $F_z$ is readily ascertainable given the amount of current to coil $C_z$ as determinable from signal $CE_z$, and from the number of windings in coil $C_z$, so from such information step 212 determines $B_z$ in that $B_z=-F_z$.

In another preferred embodiment, $B_z$ is determined from the frequency difference, $f_{diff}$, between adjacent peaks in the light intensity response plot (e.g., $P_1$) that represents the field in the z-dimension. In this regard, recall from earlier that the distance between adjacent peaks along a single plot $P_x$ is proportional to the scalar of the entire magnetic field influencing the plot (and the factor provided by the gyromagnetic ratio). However, once step 210 has been completed, then the only remaining net magnetic field is from $B_z$, that is, with $F_x$ maximally offsetting $B_x$ and $F_y$ maximally offsetting $B_y$. As a result, the distance between adjacent peaks in FIG. 5B, along the single plot, is proportional to the scalar of only $B_z$ (and, as mentioned earlier, the appropriate gyromagnetic ratio). Specifically, the intensity plot is representative of the product of the magnetic field and the gyromagnetic ratio of the alkali items in cell 112; thus, by dividing $f_{diff}$ by the gyromagnetic ratio of the alkali element in cell 112 (e.g., cesium), the result provides the magnetic field $B_z$. Accordingly, in this preferred embodiment, $B_z$ is determinable without the need for a third coil (e.g., $C_z$).

From the preceding, either preferred embodiment alternative for step 212 produces a value of $B_z$, after which method 200 continues from step 212 to step 214. Step 214 represents a conclusion of method 200, in which case the method (and the corresponding system 100 of FIG. 1) has determined each of $B_x$, $B_y$, and $B_z$, thereby representing both a amplitude and directionality for $\vec{B}$, where one skilled in the art will readily comprehend at this point that the amplitude is found from $\sqrt{(B_x)^2+(B_y)^2+(B_z)^2}$ and the directionality is the resultant vector of $B_x$, $B_y$, and $B_z$.

From the above, various preferred embodiments, as exemplified in the combination of system 100 and method 200, provide an improved magnetometer, based in part on Zeeman splitting considerations. In a preferred embodiment, the improved magnetometer may measure the external magnetic vector using less than three lasers in the three different spatial dimensions, and as also therefore may be packaged in connection with a single integrated circuit. Moreover, preferred embodiments provide alternatives for using two or three magnetic field reducers corresponding to respective orthogonal dimensions, so that a respective field of each reducer is adjustable so as to determine the equal and opposing magnetic force to that generated by the reducer. In all events, improved magnetometers are realized, as may be implanted as part of, or in connection with, numerous devices and applications. Thus, the preferred embodiments have been shown to have numerous benefits, and various embodiments have been provided. Accordingly, while various alternatives have been provided according to the disclosed embodiments, still others are contemplated and yet others may be ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A magnetometer, comprising:
   an enclosure having first and second surfaces, the enclosure configured to store an alkali metal;
   a laser optically coupled to the first surface, the laser configured to provide light along an axis in a first dimension toward the first surface and continuing through the enclosure and beyond the second surface;
   a photodetector having a photodetector input and a photodetector output, the photodetector input optically coupled to the second surface, and the photodetector configured to provide a photodetector signal at the photodetector output responsive to an intensity of light at the photodetector input;
   a first magnetic field reducer having a first input, the first magnetic field reducer configured to provide a first magnetic field responsive to a first energizing signal at the first input, the first magnetic field being in a second dimension orthogonal to the first dimension;
   a second magnetic field reducer having a second input, the second magnetic field reducer configured to provide a second magnetic field responsive to a second energizing signal at the second input, the second magnetic field being in a third dimension orthogonal to the first dimension and orthogonal to the second dimension;
   circuitry coupled to the photodetector output and to the first and second inputs, the circuitry configured to:
      measure a first magnetic influence in the first dimension responsive to the photodetector signal;
      measure a second magnetic influence in the second dimension;
      measure a third magnetic influence in the third dimension;
      adjust the first energizing signal to a first level at which the first magnetic field offsets the second magnetic influence in the second dimension; and
      adjust the second energizing signal to a second level at which the second magnetic field offsets the third magnetic influence in the third dimension.

2. The magnetometer of claim 1, wherein the circuitry is configured to measure the second magnetic influence responsive to the first level, and measure the third magnetic influence responsive to the second level.

3. The magnetometer of claim 1, wherein:
   the photodetector signal includes a first set of peaks representative of the first magnetic influence;
   the photodetector signal includes a second set of peaks representative of a resultant signal response to the second magnetic influence and the third magnetic influence;
   the circuitry is configured to measure the first magnetic influence responsive to a frequency difference between successive peaks in the first set of peaks.

4. The magnetometer of claim 1, further comprising a third magnetic field reducer having a third input, the third magnetic field reducer configured to provide a third magnetic field responsive to a third energizing signal at the third input, the third magnetic field being in the first dimension, in which the circuitry is configured to measure the first magnetic influence in the first dimension responsive to the third magnetic field.

5. The magnetometer of claim 4, wherein the third magnetic field reducer includes a coil.

6. The magnetometer of claim 1, wherein the circuitry is configured to measure the first magnetic influence in the first dimension responsive to a frequency difference between successive peaks in the photodetector signal.

7. The magnetometer of claim 1, wherein the first magnetic field reducer and the second magnetic field reducer include respective coils.

8. The magnetometer of claim 1, wherein the laser is configured to provide the light at two different frequencies along the axis.

9. The magnetometer of claim 8, wherein the circuitry is configured to sweep a difference between the two different frequencies.

10. The magnetometer of claim 9, wherein the photodetector signal varies responsive to the sweeping.

11. The magnetometer of claim 1, wherein the laser includes: a first laser configured to provide the light at a first frequency along the axis; and a second laser configured to provide the light at a second frequency along the axis.

12. The magnetometer of claim 11, wherein the circuitry is configured to sweep a difference between the first and second frequencies.

13. The magnetometer of claim 12, wherein the photodetector signal varies responsive to the sweeping.

* * * * *